United States Patent
Bin Azahar et al.

(10) Patent No.: US 11,552,050 B2
(45) Date of Patent: Jan. 10, 2023

(54) SEMICONDUCTOR DEVICE INCLUDING SEMICONDUCTOR DIES OF DIFFERING SIZES AND CAPACITIES

(71) Applicant: WESTERN DIGITAL TECHNOLOGIES, INC., San Jose, CA (US)

(72) Inventors: Ahmad Zarif Bin Azahar, Kuala Lumpur (MY); Nur Syazwani Binti Mohd Najman, Kelantan (MY); Muhammad Syafiq Bin Mazlan, Simpang Ampat (MY); Rolando Reyes, Jr., Batu Kawan (MY); Hooi Bin Lim, Gelugor (MY)

(73) Assignee: Western Digital Technologies, Inc., San Jose, CA (US)

( * ) Notice: Subject to any disclaimer, the term of this patent is extended or adjusted under 35 U.S.C. 154(b) by 204 days.

(21) Appl. No.: 17/175,069

(22) Filed: Feb. 12, 2021

(65) Prior Publication Data

US 2022/0230992 A1 Jul. 21, 2022

Related U.S. Application Data

(60) Provisional application No. 63/138,881, filed on Jan. 19, 2021.

(51) Int. Cl.
*H01L 25/065* (2006.01)
*H01L 23/00* (2006.01)

(52) U.S. Cl.
CPC ........ *H01L 25/0652* (2013.01); *H01L 24/06* (2013.01); *H01L 24/49* (2013.01); *H01L 2224/04042* (2013.01); *H01L 2224/06135* (2013.01); *H01L 2224/49112* (2013.01); *H01L 2225/06506* (2013.01); *H01L 2225/06562* (2013.01)

(58) Field of Classification Search
CPC ............................................ H01L 2225/06562
See application file for complete search history.

(56) References Cited

U.S. PATENT DOCUMENTS

| 8,270,246 | B2 | 9/2012 | Shalvi |
| 9,134,959 | B2 | 9/2015 | Chi |
| 2019/0035705 | A1 | 1/2019 | Mao |
| 2022/0076712 | A1* | 3/2022 | Park ................. H01L 27/11556 |

* cited by examiner

*Primary Examiner* — Yu-Hsi D Sun
(74) *Attorney, Agent, or Firm* — Vierra Magen Marcus LLP

(57) ABSTRACT

A semiconductor device includes a stack of semiconductor dies, stacked in a stepped offset configuration, where the dies have different storage capacities and different sizes. Using dies of different sizes allows dies to be added to the stack without adding to the footprint of the semiconductor device. Using dies of different storage capacity also allows semiconductor devices to be tailored to specific storage capacity needs.

20 Claims, 6 Drawing Sheets

SEMICONDUCTOR DEVICE INCLUDING SEMICONDUCTOR DIES OF DIFFERING SIZES AND CAPACITIES

CLAIM OF PRIORITY

The present application claims priority from U.S. Provisional Patent Application No. 63/138,881, entitled "SEMICONDUCTOR DEVICE INCLUDING SEMICONDUCTOR DIES OF DIFFERING SIZES AND CAPACITIES," filed Jan. 19, 2021, which application is incorporated by reference herein in its entirety.

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

In order to most efficiently use package footprint, it is known to stack semiconductor dies on top of each other. In order to provide access to bond pads on the semiconductor dies, the dies are stacked, either completely overlapping each other with a spacer layer in between adjacent dies, or with an offset. In an offset configuration, a die is stacked on top of another die so that the bond pads of the lower die are left exposed.

Stacking dies with an offset configuration provides a low package profile, and an improvement in electrical performance through fast bond wire transmissions times that require less energy to drive package signals. However, stacking with an offset increases the footprint of the die stack. Semiconductor dies are being made thinner and thinner, thus improving storage capacity. However, with thinner dies, package footprint in an offset stacked configuration is becoming a limiting factor in the number of dies that may be included in a semiconductor package.

DETAILED DESCRIPTION

The present technology will now be described with reference to the figures, which in embodiments, relate to a semiconductor device including a stack of semiconductor dies, stacked in an offset configuration, where the dies have different storage capacities and different sizes. Using dies of different sizes allows dies to be added to the stack without adding to the footprint of the semiconductor device. Using dies of different storage capacity also allows semiconductor devices to be tailored to specific storage capacity needs.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

Figure 1:
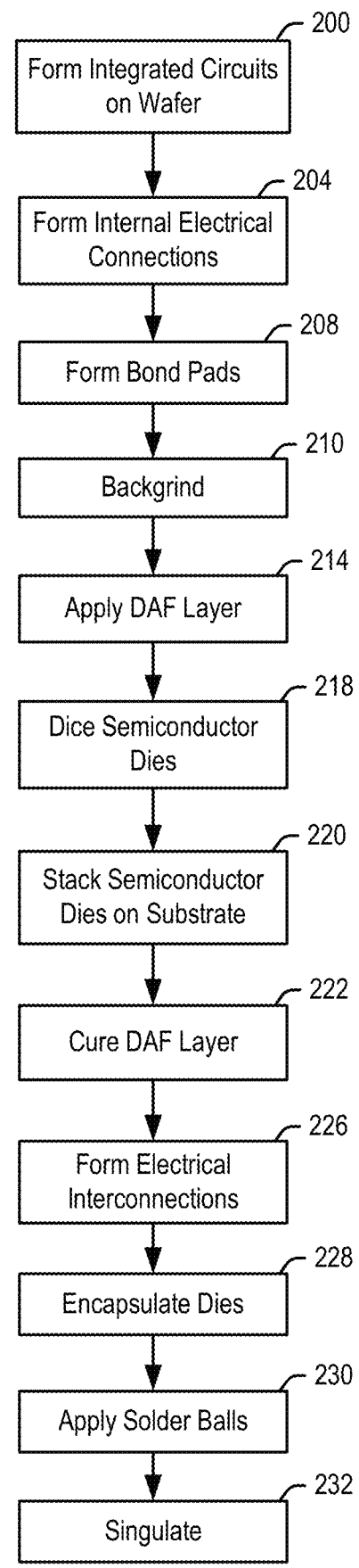
FIG. 1 is a flowchart for forming a semiconductor device according to embodiments of the present technology.
Figure 4:
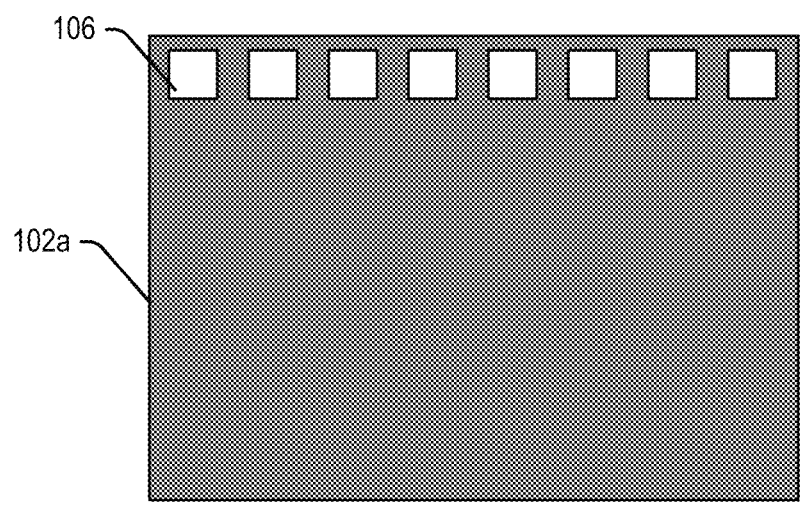
FIGS. 4-6 are top views of a semiconductor die according to embodiments of the present technology.
Figure 5:
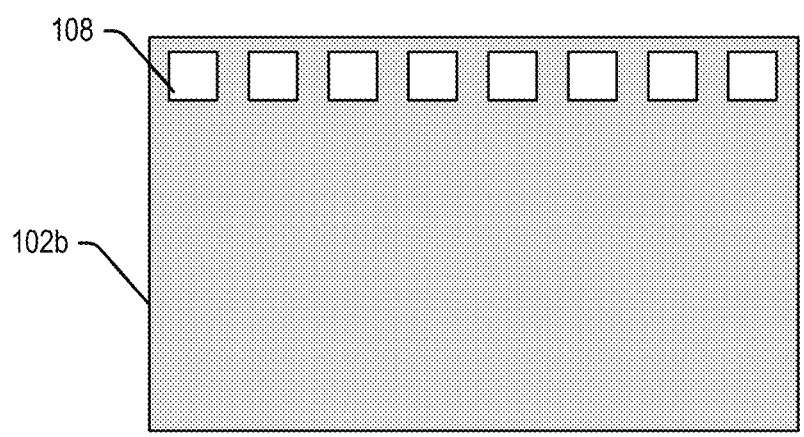
Figure 6:
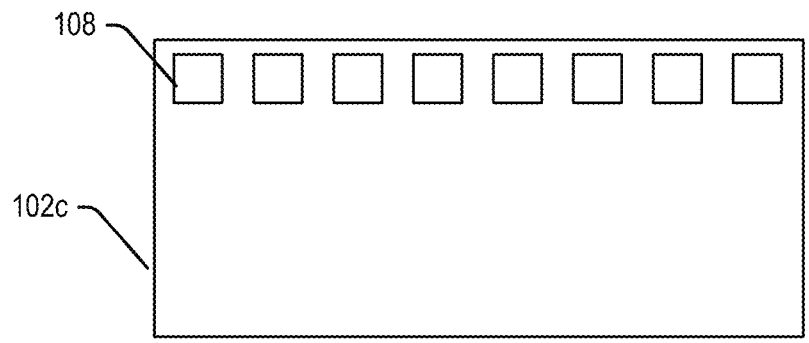

An embodiment of the present technology will now be explained with reference to the flowchart of FIG. 1, and the views of FIGS. 2-13. In step 200, a semiconductor wafer 100 may be processed into a number of semiconductor dies 102a-102c (collectively, dies 102) as shown in FIGS. 4-6. The semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

Figure 2:
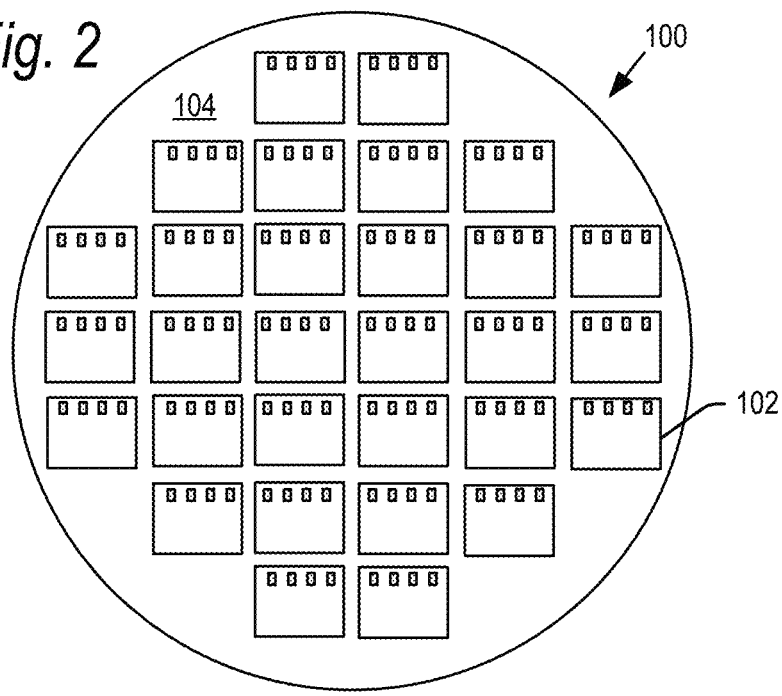
FIG. 2 is a top view of a semiconductor wafer according to embodiments of the present technology.

The semiconductor wafer 100 may be cut from the ingot and polished on both the first major planar surface 104, and second major planar surface 106 (FIG. 3) opposite surface 104, to provide smooth surfaces. The first major surface 104 may undergo various processes in step 200 to divide the wafer 100 into the respective semiconductor dies 102, and to form integrated circuits 122 of the respective semiconductor dies 102 on and/or in the first major surface 104. The number and pattern of semiconductor dies 102 shown on wafer 100 in FIG. 2 is for illustrative purposes, and wafer 100 may include more semiconductor dies 102 than are shown, and in different patterns, in further embodiments.

Figure 3:
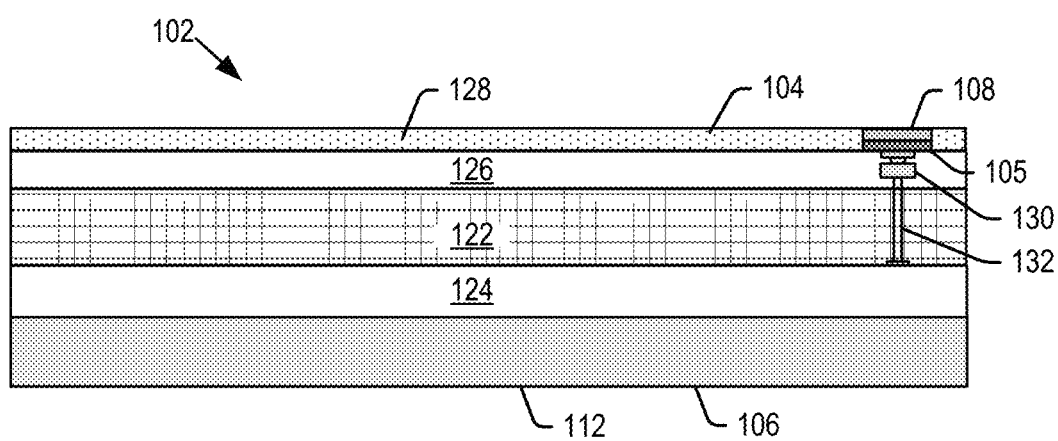
FIG. 3 is a cross-sectional edge view of a semiconductor die according to embodiments of the present technology.

The integrated circuits 122 formed in step 200 may include memory cells and logic formed in a dielectric substrate including layers 124 and 126 as shown in the cross-sectional edge view of FIG. 3. In embodiments, the integrated circuits 122 may be formed as a 3D stacked memory array having strings of memory cells formed into layers. However, it is understood that the semiconductor die 102 may be processed to include integrated circuits other than a 3D stacked memory structure. The semiconductor dies 102 may for example be flash memory die such as 2D NAND flash memory or 3D BiCS (Bit Cost Scaling), V-NAND or other 3D flash memory, but other types of dies 102 may be used. In embodiments, the memory array may have different sizes, thus providing die 102 with different storage capacities, as explained below. A passivation/polyimide layer 128 may be formed on top of the upper dielectric film layer 126.

After formation of the integrated circuits 122, internal electrical connections may be formed within the semiconductor die 102 in step 204. The internal electrical connections may include multiple layers of metal interconnects 130 and vias 132 formed sequentially through layers of the dielectric film 126. As is known in the art, the metal interconnects 130, vias 132 and dielectric film layers 126 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 130 may be formed of a variety of electrically conductive metals including for example copper and copper alloys as is known in the art, and the vias 132 may be lined and/or filled with a variety of electrically conductive metals including for example tungsten, copper and copper alloys as is known in the art.

In step 208, bond pads may be formed on the major planar surface 104 of the semiconductor dies 102. As shown in FIGS. 4-6, these bond pads may include a row of bond pads 108, but it is understood that the bond pads 108 may be provided on the surface of die 102 in a variety of patterns and in various numbers. The passivation layer 128 may be etched, and each bond pad 108 may be formed over a liner 105 in the etched regions of the passivation layer. As is known in the art, the bond pads 108 may be formed for example of copper, aluminum and alloys thereof, and the liner 105 may be formed for example of a titanium/titanium nitride stack such as for example Ti/TiN/Ti, though these materials may vary in further embodiments. The bond pads 108 and liner 105 may be applied by vapor deposition and/or plating techniques. The bond pads and liners together may have a thickness of 720 nm, though this thickness may be larger or smaller in further embodiments. The integrated circuits 122 may be electrically connected to the bond pads 108 by the metal interconnects 130 and vias 132.

In step 210, the inactive surface of the wafer 100, and in particular, dielectric layer 124 may undergo a backgrind process to thin the wafer 100 to a final thickness. In embodiments, the final thickness of the wafer may for example be 20 μm to 40 μm, though the final thickness may be lesser or greater than that in further embodiments. A die attach film (DAF) layer (not shown) may be affixed to the inactive surface 106 in step 214 by spin-coating or other methods and cured to a B-stage. As one example, the DAF layer may be 8988UV epoxy from Henkel AG & Co. KGaA, though other types of films may be used. The DAF layer may be 5 μm to 10 μm, though it may be thinner or thicker than tha in further embodiments. As explained below, the DAF layer may be cured to final C-stage after the dies 102 are assembled into a die stack on a substrate.

In step 218, the individual dies may be diced from wafer 100 by known methods such as for example by laser or saw blade to provide individual semiconductor dies 102. Examples of such dies 102a-102c are shown in FIGS. 4-6, respectively. It is a feature of the present technology to form a die stack in a semiconductor device using dies of different sizes and storage capacities.

FIG. 4 shows a first die 102a of a first size and first storage capacity. In embodiments, the first die 102a may be a 1.33 terabit (166 gigabyte) BiCS memory die, with a width of 45 mm, and a length of 52 mm, though the amount of storage and the dimensions of the first die 102a may vary, proportionally or disproportionally with each other, in further embodiments.

FIG. 5 shows a second die 102b of a second size and second storage capacity. In embodiments, the second die 102b may be a 512 gigabit (64 gigabyte) BiCS memory die, with a width of 45 mm, and a length of 29 mm, though the amount of storage and the dimensions of the second die 102b may vary, proportionally or disproportionally with each other, in further embodiments.

FIG. 6 shows a third die 102c of a third size and third storage capacity. In embodiments, the third die 102c may be a 256 gigabit (32 gigabyte) BiCS memory die, with a width of 45 mm, and a length of 18 mm, though the amount of storage and the dimensions of the third die 102c may vary, proportionally or disproportionally with each other, in further embodiments. In addition to being shown with different sizes, the dies 102a-102c are differentiated from each other in the figures with different shading.

Figure 7:
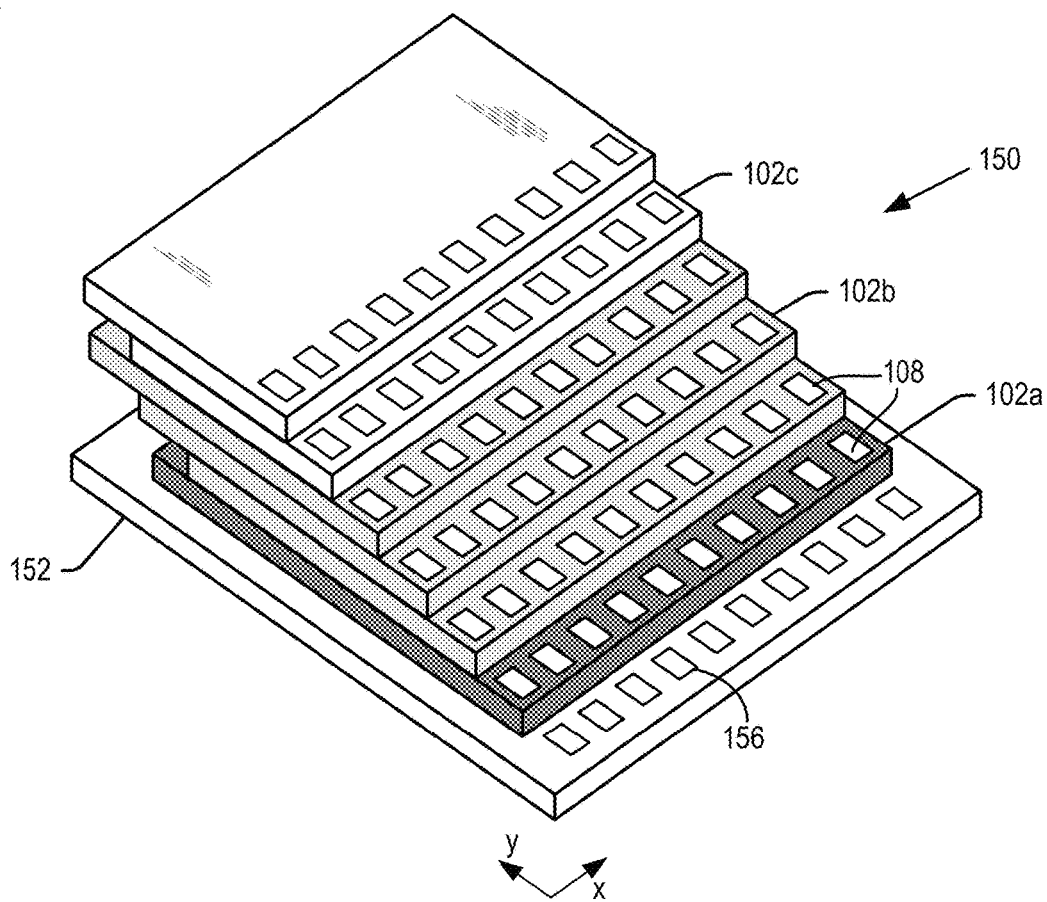
FIG. 7 is a perspective view of a semiconductor device at a first stage in fabrication according to embodiments the present technology.
Figure 8:
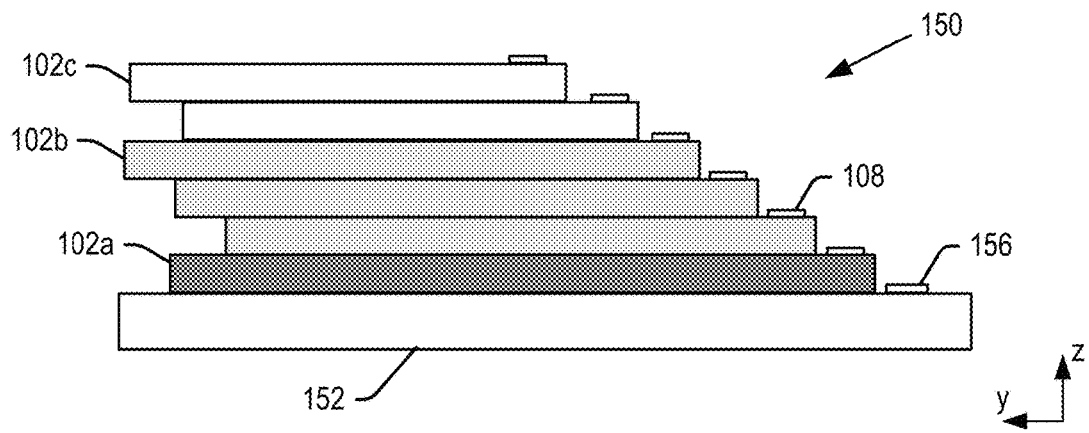
FIG. 8 is an edge view of the semiconductor device of FIG. 7.

FIGS. 7-13 each show a partial or complete semiconductor package 150 formed by stacking dies 102a-102c on a substrate 152 (step 220) in different combinations. FIGS. 7 and 8 show a perspective view and an edge view, respectively, of a first configuration using each of dies 102a, 102b and 102c, specifically, one first die 102a, three second dies 102b and two third dies 102c. The dies are stacked on each other with a stepped offset so that the bond pads 108 of a die 102 are left exposed by the next upper die 102. In accordance with the present technology, the dies 102 may be stacked such that the same size die or a smaller die may be placed on top of the die below it. As can be seen, using the same size or smaller dies up the stack allows more dies to be maintain their offset without exceeding the footprint (specifically in the y-direction) of the substrate 152. The type of dies (102, 102b and/or 102c) used and the number of dies 102 shown in the die stack are by way of example only, and embodiments may include different combinations of dies 102 and different numbers of dies 102.

The combination shown in FIGS. 7 and 8 includes:
(1) 166 gigabyte (GB) die 102a,
(3) 64 GB dies 102b, and
(2) 32 GB dies 102c, to provide a total device storage capacity of 422 GB.

The type and number of each die 102a-102c may be selected to customize devices 150 for particular applications that requires a specific storage capacity. Alternatively, the semiconductor device 150 may be fabricated with a wide variety of combinations to provide a wide variety of storage capacity options so that end users may pick that storage capacity that fits their needs with a high degree of granularity.

After stacking, the DAF layer of each of the dies may be cured in step 222 from a b-stage to a final c-stage to permanently affix the dies 102 to each other and the substrate 152. The DAF layer may be hardened to the c-stage by heat and pressure. In one example, the die stack may be heated to 150° C. for several hours to cure the DAF layers, though the temperature and duration may vary in further embodiments. Upon curing of the DAF layers, the dies are fixed in position in the stack.

Figure 9:
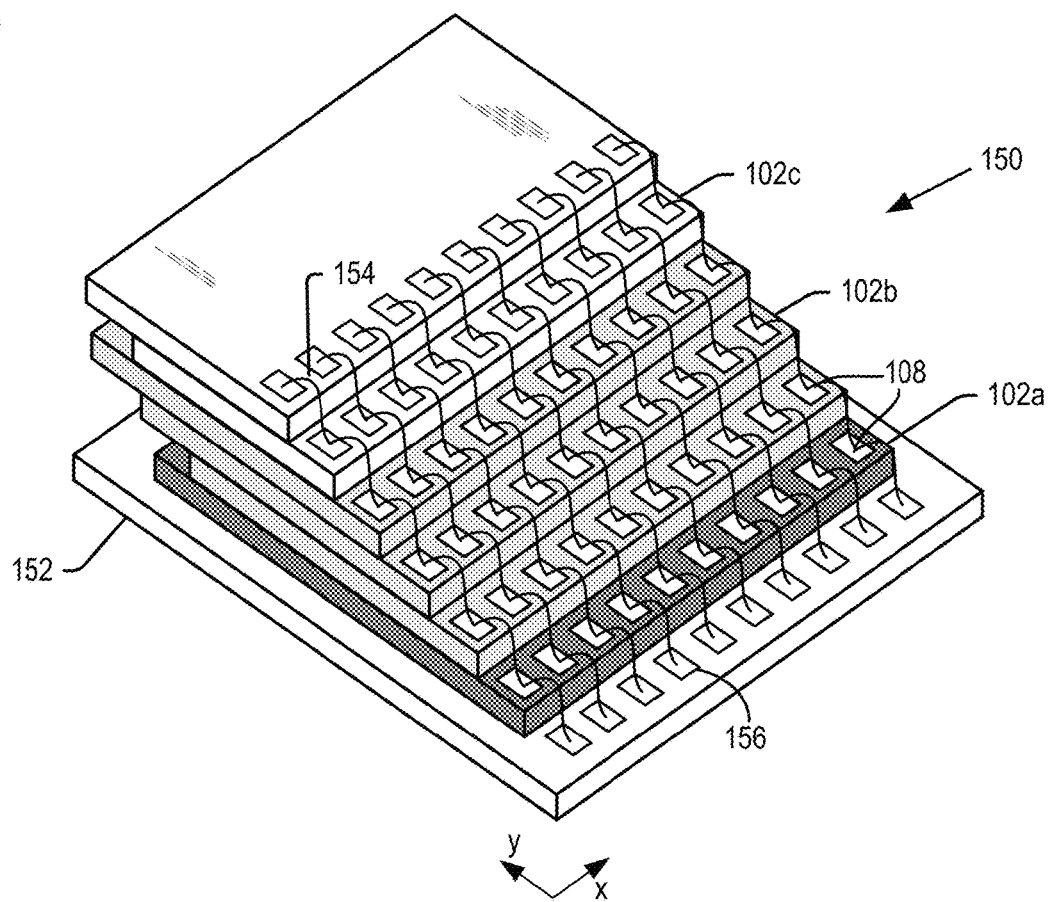
FIG. 9 is a perspective view of a semiconductor device at a second stage in fabrication according to embodiments the present technology.
Figure 10:
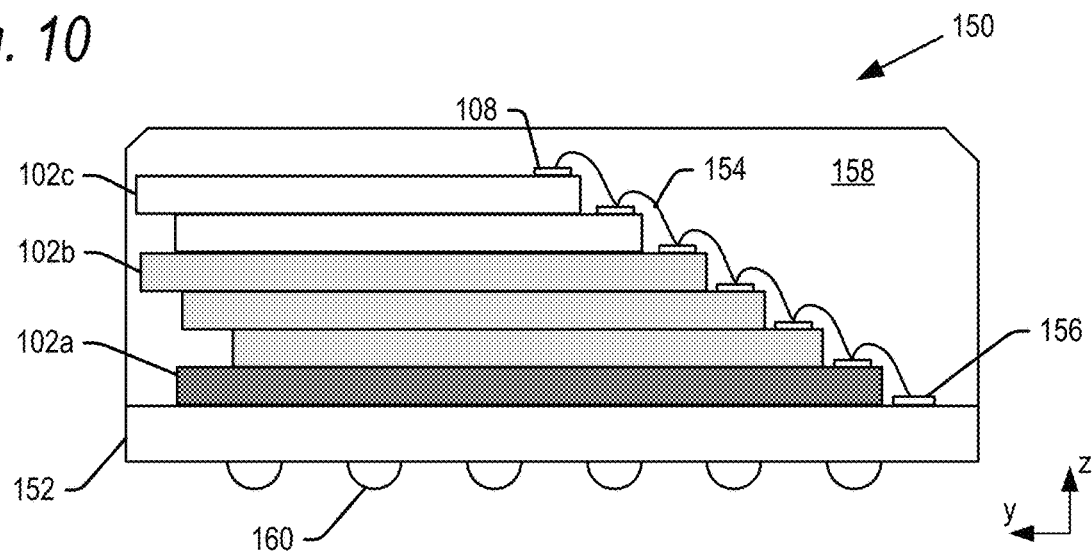
FIG. 10 is an edge view of a completed semiconductor device according to embodiments of the present technology.

In step 226, the semiconductor dies 102 may be electrically interconnected to each other and to the substrate 152. FIGS. 9 and 10 show a perspective view and an edge view, respectively, of wire bonds 154 formed between corresponding die bond pads 108 on respective dies 102 down the die stack, and then bonded to contact pads 158 on an upper surface of the substrate 152. The wire bonds may be formed by a ball-bonding technique, but other wire bonding techniques are possible. The semiconductor dies 102 may be electrically interconnected to each other and the substrate 152 by other methods in further embodiments. One such method is by through-silicon vias (TSVs), in which embodiment the dies 102*a*, 102*b* and/or 102*c* may be stacked directly on top of each other without an offset.

Following electrical connection of the dies 102 to the substrate 152, the semiconductor device 150 may be encapsulated in a mold compound 158 in a step 228 and as shown in FIG. 10. Mold compound 158 may include for example solid epoxy resin, Phenol resin, fused silica, crystalline silica, carbon black and/or metal hydroxide. Other mold compounds are contemplated. The mold compound may be applied by various known processes, including by compression molding, FFT (flow free thin) molding, transfer molding or injection molding techniques.

Where the semiconductor device 150 is a BGA (ball grid array) package, solder balls 160 (FIG. 10) may be affixed to the contact pads on a lower surface of substrate 152 in step 230 as shown in FIG. 10. The solder balls 160 may be used to solder the semiconductor device 150 to a host device (not shown), such as a printed circuit board. Where the semiconductor device 150 is an LGA (land grid array) package, contact fingers (not shown) may be substituted for solder balls 160.

The semiconductor device 150 may be formed on a panel of substrates for economies of scale. After formation and encapsulation of the substrates 152, the substrates 152 may be singulated from each other in step 232 to form a finished semiconductor device 150 as shown in FIG. 10. The semiconductor devices 150 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 150, it is understood that semiconductor device 150 may have shapes other than rectangular and square in further embodiments of the present technology.

Figure 11:
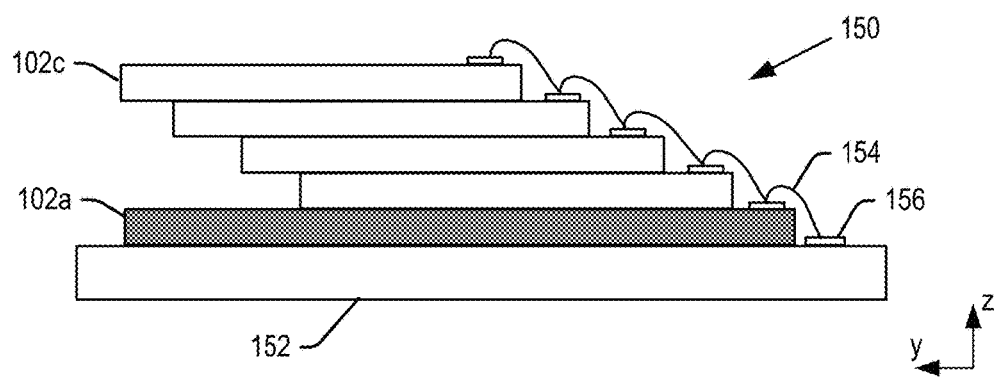
FIGS. 11-13 are edge views of die stacks according to alternative embodiments of the present technology.

As noted above, the dies 102*a*, 102*b* and/or 102*c* may be used in any of a wide variety of combinations to provide semiconductor devices 150 with a wide range of storage capacities. In each such drive, the same size die or a smaller die may be placed on top of a die below it. In this way, the dies 102 may be stacked to provide a maximum or customized storage capacity to semiconductor device 150. FIG. 11 shows an edge view of an embodiment including (1) die 102*a* (storage capacity 166 GB) and (4) dies 102*c* (total storage capacity of 128 GB) for a total drive storage capacity of 294 GB.

Figure 12:
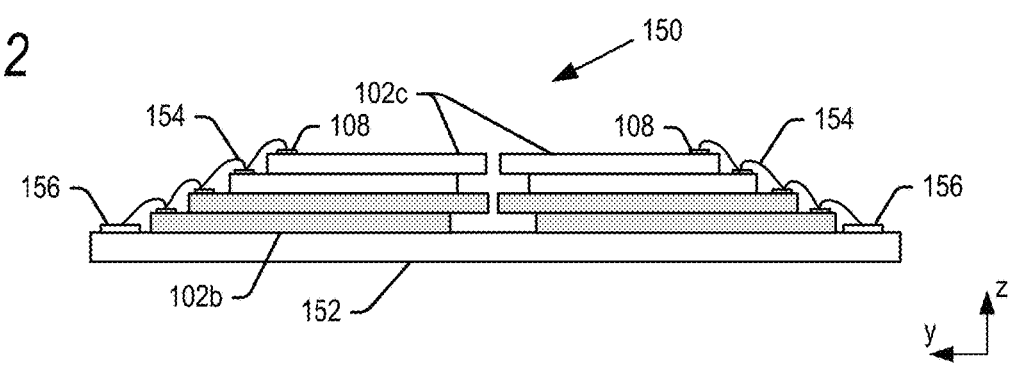

FIG. 12 shows an edge view of a further embodiment including two stacks of dies 102 on substrate 152, stepped offset toward each other. Again, using a single size die (such as dies 102*b*) for each of the stacks would quickly result in a conflict (at the third level of dies in the embodiment shown in FIG. 12) preventing the use of additional dies in the stack. However, by using a combination including larger dies 102*b* and smaller dies 102*c*, additional levels may be included in the die stacks without conflict. In the embodiment shown, each stack includes (2) dies 102*b* (total storage capacity 128 GB) and (2) dies 102*c* (total storage capacity of 64 GB) for a total drive storage capacity of 394 GB. The stacks shown in FIG. 12 need not be identical to each other in further embodiments.

Figure 13:
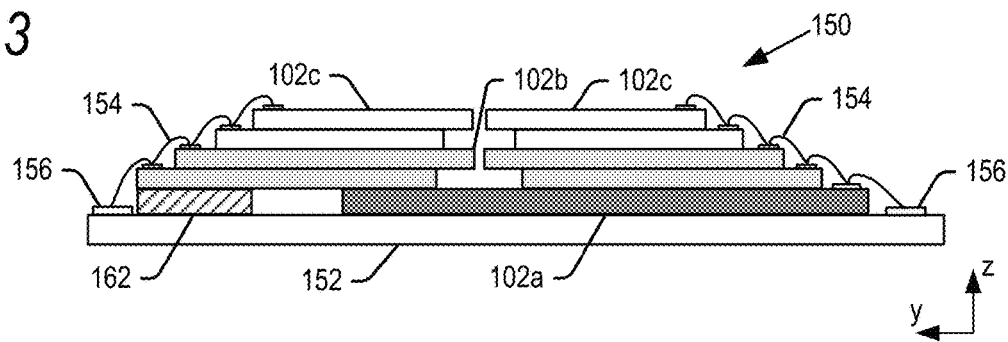

FIG. 13 is similar to FIG. 12, but further includes a die 102*a* at the bottom of the stack. The total drive storage capacity of the semiconductor device 150 shown is 560 GB. A spacer 162 may be used with die 102*a* at the bottom of the stack to provide a flat support base for the rest of the dies in the stacks.

It is known in the prior art to include dies of different storage capacities within a semiconductor package. However, such packages are not configured to tailor a semiconductor device to one of a wide variety of storage capacities so that an end user can select the storage capacity that is right for their application. Moreover, the present technology provides a semiconductor device having a die stack with different sized semiconductor die, specifically configured to fit within the footprint of the substrate and package. This advantage is not found in the prior art.

In embodiments described above, the dies 102*a*, 102*b* and 102*c* have storage capacities of 166 GB, 64 GB and 32 GB. These storage capacities are by way of example only, and other dies, having other sizes and other storage capacities, may be used such that the same size die or a smaller die may be placed on top of a die below it.

In the embodiments described above, the die stack comprises two or more different semiconductor dies from the group of three different sized semiconductor dies (102*a*, 102*b* and 102*c*). In further embodiments, the die stack may include two or more different semiconductor dies from a group including only two different sized dies, or from a group comprising more than three different sized dies.

In summary, the present technology relates to a semiconductor device, comprising: a substrate comprising a footprint having a length; and a plurality of semiconductor memory dies stacked on the substrate; a plurality of bond pads along a first edge of each of the plurality of semiconductor memory dies, the plurality of semiconductor memory dies stacked on each other with a stepped offset from each other at a first edge leaving the plurality of bond pads of each semiconductor die exposed; wherein the plurality of semiconductor memory dies, offset on the substrate, are configured to fit within the footprint of the substrate by stacking a first group of one or more memory dies of the plurality of semiconductor memory dies on top of a second group of one or more memory dies of the plurality of semiconductor memory dies, the first group having a smaller length and smaller storage capacity than the second group of semiconductor dies.

In another example, the present technology relates to a semiconductor device, comprising: a substrate comprising a footprint having a length; and a plurality of semiconductor memory dies stacked on the substrate; a plurality of bond pads along a first edge of each of the plurality of semiconductor memory dies, the plurality of semiconductor memory dies stacked on each other with a stepped offset from each other at a first edge leaving the plurality of bond pads of each semiconductor die exposed; wherein the plurality of semiconductor memory dies, offset stepped on the substrate, are configured to fit within the footprint of the substrate by the plurality of semiconductor memory dies comprising dies of different lengths, and by stacking the plurality of semiconductor memory dies such that each die of the plurality of semiconductor memory dies is mounted on top of a larger or same sized die of the plurality of semiconductor memory dies, dies of different lengths having different storage capacities.

In a further example, the present technology relates to a semiconductor device, comprising: a substrate comprising a footprint having a length; and means for storing data stacked on the substrate, the means stacked on each other with a stepped offset from each other at a first edge leaving the plurality of bond pads of each semiconductor die exposed; wherein the means for storing data are configured to fit within the footprint of the substrate by stacking a first of the means for storing data on top of a second of the means for storing data, the first means having a smaller length and smaller storage capacity than the second means.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a substrate comprising a footprint having a length; and
   a plurality of semiconductor memory dies stacked on the substrate;
   a plurality of bond pads along a first edge of each of the plurality of semiconductor memory dies, the plurality of semiconductor memory dies stacked on each other with a stepped offset from each other at the first edge leaving the plurality of bond pads of each semiconductor die exposed;
   wherein the plurality of semiconductor memory dies, offset on the substrate, are configured to fit within the footprint of the substrate by stacking a first group of one or more memory dies of the plurality of semiconductor memory dies on top of a second group of one or more memory dies of the plurality of semiconductor memory dies, the first group having a smaller length and smaller storage capacity than the second group of semiconductor dies.

2. The semiconductor device of claim 1, further comprising a third group of one or more semiconductor dies of the plurality of semiconductor dies stacked on top of the first group of one or more semiconductor dies of the plurality of semiconductor dies, the third group having a smaller length and smaller storage capacity than the first group of semiconductor dies.

3. The semiconductor device of claim 1, wherein the one or more memory dies in the third group have a storage capacity of 32 gigabytes.

4. The semiconductor device of claim 1, wherein the one or more memory dies in the second group have a storage capacity of 166 gigabytes.

5. The semiconductor device of claim 1, wherein the one or more memory dies in the first group have a storage capacity of 64 gigabytes.

6. The semiconductor device of claim 1, further comprising a plurality of bond wires electrically coupling the die bond pads of the plurality of semiconductor memory dies to each other and the substrate.

7. The semiconductor device of claim 1, wherein the plurality of semiconductor memory dies stacked on the substrate comprise a first plurality of semiconductor memory dies stacked on the substrate, the semiconductor device further comprising a second plurality of semiconductor memory dies stacked on the substrate alongside the first plurality of semiconductor memory dies.

8. The semiconductor device of claim 7, wherein the first and second pluralities of semiconductor memory dies fit within the footprint of the substrate.

9. The semiconductor device of claim 8, wherein the second plurality of semiconductor memory dies are offset stepped on the substrate.

10. The semiconductor device of claim 9, wherein the second plurality of semiconductor memory dies comprise a fourth group of one or more memory dies of the second plurality of semiconductor memory dies on top of a fifth group of one or more memory dies of the second plurality of semiconductor memory dies, the fourth group having a smaller length and smaller storage capacity than the fifth group of semiconductor dies.

11. A semiconductor device, comprising:
    a substrate comprising a footprint having a length; and
    a plurality of semiconductor memory dies stacked on the substrate;
    a plurality of bond pads along a first edge of each of the plurality of semiconductor memory dies, the plurality of semiconductor memory dies stacked on each other with a stepped offset from each other at a first edge leaving the plurality of bond pads of each semiconductor die exposed;
    wherein the plurality of semiconductor memory dies, offset stepped on the substrate, are configured to fit within the footprint of the substrate by the plurality of semiconductor memory dies comprising dies of different lengths, and by stacking the plurality of semiconductor memory dies such that each die of the plurality of semiconductor memory dies is mounted on top of a larger or same sized die of the plurality of semiconductor memory dies, dies of different lengths having different storage capacities.

12. The semiconductor device of claim 11, wherein the plurality of semiconductor memory dies comprise memory dies of two different sizes.

13. The semiconductor device of claim 11, wherein the plurality of semiconductor memory dies comprise memory dies of two different storage capacities.

14. The semiconductor device of claim 11, wherein the plurality of semiconductor memory dies comprise memory dies of three different sizes.

15. The semiconductor device of claim 11, wherein the plurality of semiconductor memory dies comprise memory dies of three different storage capacities.

16. The semiconductor device of claim 11, further comprising a plurality of bond wires electrically coupling the die bond pads of the plurality of semiconductor memory dies to each other and the substrate.

17. The semiconductor device of claim 11, wherein the plurality of semiconductor memory dies stacked on the substrate comprise a first plurality of semiconductor memory dies stacked on the substrate, the semiconductor device further comprising a second plurality of semiconductor memory dies stacked on the substrate alongside the first plurality of semiconductor memory dies and offset stepped in an opposite direction than the first plurality of semiconductor memory dies, the first and second pluralities of semiconductor memory dies fitting within the footprint of the substrate.

18. The semiconductor device of claim 17, wherein the second plurality of semiconductor memory dies, offset stepped on the substrate, are configured to fit within the footprint of the substrate with the first plurality of semiconductor memory dies by the second plurality of semiconductor memory dies comprising dies of different lengths, and by stacking the second plurality of semiconductor memory dies such that each die of the second plurality of semiconductor memory dies is mounted on top of a larger or same sized die of the second plurality of semiconductor memory dies, dies of different sizes having different storage capacities.

19. The semiconductor device of claim 17, further comprising a spacer beneath one of the first and second pluralities of memory dies.

20. A semiconductor device, comprising:
a substrate comprising a footprint having a length; and
means for storing data stacked on the substrate, the means stacked on each other with a stepped offset from each other at a first edge leaving a plurality of bond pads of each data storing means exposed;
wherein the means for storing data are configured to fit within the footprint of the substrate by stacking a first of the means for storing data on top of a second of the means for storing data, the first means having a smaller length and smaller storage capacity than the second means.

* * * * *